(12) United States Patent
Chen et al.

(10) Patent No.: US 11,469,340 B2
(45) Date of Patent: Oct. 11, 2022

(54) SOLAR CELL STRING, STRING GROUP, MODULE, AND MANUFACTURING METHOD THEREOF

(71) Applicant: JINGAO SOLAR CO., LTD., Hebei (CN)

(72) Inventors: Hongyue Chen, Jiangsu (CN); Yanfang Zhou, Jiangsu (CN)

(73) Assignee: JINGAO SOLAR CO., LTD., Hebei (CN)

( * ) Notice: Subject to any disclaimer, the term of this patent is extended or adjusted under 35 U.S.C. 154(b) by 0 days.

(21) Appl. No.: 16/980,143

(22) PCT Filed: May 7, 2019

(86) PCT No.: PCT/CN2019/085895
§ 371 (c)(1),
(2) Date: Sep. 11, 2020

(87) PCT Pub. No.: WO2019/214627
PCT Pub. Date: Nov. 14, 2019

(65) Prior Publication Data
US 2021/0257506 A1    Aug. 19, 2021

(30) Foreign Application Priority Data

May 9, 2018  (CN) .......................... 201810439187.3

(51) Int. Cl.
*H01L 31/05*   (2014.01)
*H01L 31/049*  (2014.01)
*H02S 50/15*   (2014.01)

(52) U.S. Cl.
CPC ........ *H01L 31/0516* (2013.01); *H01L 31/049* (2014.12); *H02S 50/15* (2014.12)

(58) Field of Classification Search
CPC ... H01L 31/042; H01L 31/044; H01L 31/049; H01L 31/0504; H01L 31/0516; H02S 40/34; H02S 20/25; H02S 50/15
See application file for complete search history.

(56) References Cited

U.S. PATENT DOCUMENTS

| | | | |
|---|---|---|---|
| 2014/0026955 A1* | 1/2014 | Nishimoto | H01L 31/022425 136/256 |
| 2017/0012156 A1* | 1/2017 | Lim | H01L 31/0512 |
| 2019/0013428 A1* | 1/2019 | Shi | H01L 31/048 |

FOREIGN PATENT DOCUMENTS

| CN | 106784105 A | * | 5/2017 |
|---|---|---|---|
| CN | 206992118 U | | 2/2018 |

(Continued)

OTHER PUBLICATIONS

Machine translation of CN-106784105-A, Shan Wei et al. (Year: 2017).*

*Primary Examiner* — Mayla Gonzalez Ramos
(74) *Attorney, Agent, or Firm* — Greenberg Traurig, LLP

(57) ABSTRACT

Disclosed is a solar cell string, a string group, a module, and a manufacturing method thereof. The solar cell string is formed by connecting a plurality of first type of solar cells and at least one second type of solar cell, wherein front electrodes of the plurality of first type of solar cells (701) have the same polarity, back electrodes of the plurality of first type of solar cells (701) also have the same polarity, and the polarity of the front electrodes of the first type of multiple solar cells (701) is opposite to the polarity of the back electrodes. Back electrodes on a back side of the second type of solar cell (801) comprise a positive electrode and a negative electrode. The solar cell string utilizes two structures of solar cells to establish a stacked connection of shingles, thereby enabling a current carrying unit to direct current out of the back side of the solar cells, making it (Continued)

easier to incorporate a diode, causing no size increase in the module area, reducing the wafer breakage rate, and accordingly raising the module pass rate and assembling efficiency. Further disclosed is a string group formed by the solar cell string, a module, and a manufacturing method thereof.

6 Claims, 7 Drawing Sheets

(56) References Cited

FOREIGN PATENT DOCUMENTS

| | | |
|---|---|---|
| CN | 108649087 A | 10/2018 |
| WO | 2017143190 A1 | 8/2017 |

* cited by examiner

SOLAR CELL STRING, STRING GROUP, MODULE, AND MANUFACTURING METHOD THEREOF

CROSS-REFERENCE TO RELATED APPLICATIONS

This application is the U.S. National Phase of International Application No. PCT/CN2019/085895, filed May 7, 2019, which claims the benefit of Chinese Application No. 201810439187.3, filed May 9, 2018, both of which are incorporated by reference herein their entirety.

TECHNICAL FIELD

The invention relates to the technical field of solar cells, and in particular relates to a solar cell string, string group, module and manufacturing method thereof.

BACKGROUND

With the continuous development of society, humans pay more and more attention to the use of renewable energy, and solar energy is the easiest energy for us to obtain. How to use solar energy has always been a subject of human research. Therein, the solar cell is one of the most effective ways to convert solar energy into electrical energy.

In recent years, the world output of solar cells has increased at a rate of 30-40% per year, and it becomes one of the fastest growing industries on the market. Among them, crystalline silicon solar cells have gradually developed and matured, occupying a dominant position in the market.

With the development of crystalline silicon solar cell technology, various high-efficiency cell technologies have gradually matured. Compared with conventional cells, these high-efficiency cells have good passivation on both sides, and the current and voltage are higher. In particular, double-sided cells can absorb light to generate photo-generated carriers, so they have a higher short-circuit current.

In the manufacture of conventional module, the interconnection between cells is often connected in series. The higher the cell current is, the greater the transmission loss of the module power on the interconnect bar will be. Therefore, when using these high-efficiency double-sided cells to make modules, if still using the conventional solder strip interconnection technology, it is imaginable that the power loss from the cell to the module will be very high, and the high conversion efficiency obtained at the cell end cannot be fully achieved at the module end. Therefore, people are also seeking various solutions to achieve the improvement of solar cell module power.

The power loss from the cell to the module is mainly divided into optical loss and electrical loss. The optical loss is mainly related to the absorption and reflection of materials such as glass and EVA. The electrical loss mainly comes from the inside of the cell, the interconnection bar, the bus bar, and the junction box. If the internal resistance of these connecting materials cannot be effectively reduced, most of the energy will be lost in the form of heat instead of being converted into electrical energy.

In this case, the shingled connection method (a connection method of cutting the cell into small solar cells and using conductive materials such as conductive adhesive and the like instead of welding strip to superimpose the electrode of one of the small solar cells on the electrode of the adjacent one) is increasingly used in the production of high-efficiency cell modules. At present, no matter the 60P or 72P version of the conventional shingled module, the horizontal version is mostly used, so the number of cells in each string is smaller than that of the vertical row. After incorporating the diode, the performance of the module against hot spots is excellent.

However, in order to save the installation cost when actually installing the horizontal module, vertical installation is still selected. In this way, such modules require longer cables, or the cables will inevitably need to be crossed, or the installation direction of the modules needs to be adjusted, which is inconvenient; in addition, the width of such modules is larger than the width of conventional modules, and the installation cost is also higher than conventional modules; the length and width of raw materials such as glass, back plate and packaging materials required for the modules have changed, and the cost of raw materials has also increased greatly.

Making vertical shingled modules with the same specifications as conventional modules in this way is a new product that most module companies need to develop. Vertical module, with the length of 60 P module is about 1650 mm, and the length of 72 P module is about 1980 mm. If the same size of sliced solar cells is used, the number of cells in each string is 1.5 to 2 times the number of cells in the horizontal module. If the vertical module has the same resistance to hot spots as the horizontal module, a parallel diode is also required in the middle of each string of cells.

At present, the common method is to separate the cell strings at the required length, using the bus bar to weld and incorporate the diode. An important advantage of shingled modules is to remove the gap between the cells and increase the utilization rate of the module area. Using this method increases the bus belt and increases the gap between the cells at the joints. At the same time, the debris rate is increased. effectiveness. As the length of the module increases, the efficiency of the module also decreases.

In the prior art, when the vertical shingled module is manufactured, if the diode needs to be incorporated, the cell string needs to be segmented, and then the bus string is used to connect the cell string. Therefore, the area of the module cannot be fully utilized, and the connection of the cell string will inevitably increase the risk of debris. In addition, when only one structure is used to connect the shingles, it is impossible to draw all the welding strip from the back of the solar cell.

Therefore, it is necessary to continue to develop new solar modules and preparation methods thereof to improve the power generation efficiency of the modules and reduce the power generation costs of the modules.

SUMMARY

The first object of the present invention is to provide a solar cell string that utilizes two types of structures of solar cells to establish a shingled connection, thereby enabling a current derivation unit to direct current out of the back side of the solar cells, making it easier to incorporate a diode when assembling a cell module, causing no size increase in the module area, reducing the wafer breakage rate of solar cells and accordingly raising the module pass rate and assembling efficiency.

The second object of the present invention is to provide a solar cell string group formed by the above solar cell string.

The third object of the present invention is to provide a solar cell module having the above solar cell string group.

The fourth object of the present invention is to provide a method for manufacturing the above solar cell module, which can increase the power generation efficiency of the module and reduce the power generation cost of the module.

The above-mentioned first object of the present invention is achieved by the following technical solution: a solar cell string, which is formed by connecting a plurality of first type of solar cells and at least one second type of solar cell, wherein the polarities of the front electrodes of the plurality of first type of solar cells are consistent, and the polarities of the back electrodes of the plurality of the first type of solar cells are also consistent, and the polarities of the front electrodes and the back electrodes of the plurality of the first solar cells are in contrast, The back electrode on the back of the second type of solar cell includes a positive electrode and a negative electrode.

In other words, the first type of solar cell is a conventional solar cell, and the second type of solar cell (801) is a back-contact solar cell. With this design, the front and back sides of two adjacent solar cells can be connected simultaneously without using a bus bar (welding strip). When using the cell string to assemble a cell module, the production speed and efficiency of the module can be effectively improved, and the wafer breakage rate is reduced during the process of manufacturing the module. At the same time, on the basis of ensuring the hot spot resistance of the module, the effective utilization rate of the module area is increased, and the power generation efficiency of the module is increased. In addition, by providing the second type of solar cells, the parallel connection between the cell strings becomes easy. Moreover, the solder strips can all be led out from the back, making the structure of the module simpler.

Optionally, the first type of solar cell includes one or more of an A-I type of solar cell, an A-II type of solar cell, and an A-III type of solar cell, each of which includes one or more solar cells, wherein, the A-I type of solar cell has one front electrode and one back electrode, and the front electrode and the back electrode are formed on opposite edges of the first type of solar cell; the A-II type of solar cell has two back electrodes, one of which is located at the edge of the back side of the A-II type of solar cell, and the other is located in the middle of the back side of the A-II type of solar cell; the A-III type of solar cell has two front electrodes located on opposite edges of the front side of the first type of solar cell (701), and one back electrode located in the middle of the back side.

In addition, the second type of solar cell (801) may include one or more of a B-I type of solar cell, a B-II type of solar cell, a B-III type of solar cell, and a B-IV type of solar cell, each of which includes one or more solar cells, wherein the back side of the B-I type of solar cell includes two negative electrodes and one positive electrode located in the middle, one negative electrode is located at the edge and one negative electrode is located in the middle. The back side of B-II type of solar cell includes one positive electrode and one negative electrode, the negative electrode is located at the edge and the positive electrode is located at the middle or edge; the back of the B-III type of solar cell includes two positive electrodes and one negative electrode, wherein the negative electrode is located at the edge, one positive electrode is located at the opposite edge and the other positive electrode is located at the middle; the back of the B-IV type of solar cell includes two positive electrodes and one negative electrode, where two positive electrodes are located at the edge and one negative electrode is located at the middle.

With this design, the layout can be designed as needed to combine different kinds of the first type of solar cell (701) and the second type of solar cell (801), an to produce a cell string of any length.

Further, the second type of solar cell may be a back-contact cell. For Example, the front side of the second type of solar cell may be provided with a front electrode (for Example, MWT structure), or may not be provided with none front electrode (for Example, IBC structure). When the front electrode of the second type of solar cell is provided with a front electrode, the positive electrode of the back electrode of the second type of solar cell (801) is led to the front electrode through a perforation method.

Therefore, the second type of solar cell can be applied in the middle of the cell string, and the first type of solar cell is connected in series on both sides thereof, so as to meet the needs of more design layouts.

Optionally, the structures of the plurality of first type of solar cells (701) are the same, and when the plurality of second type of solar cells (801) are included, the structures of the plurality of second type of solar cells are also the same. That is to say, preferably, the first type of solar cell is formed by cutting a whole solar cell, and the second type of solar cell is also formed by cutting a whole solar cell. Compared with the whole solar cell, the first solar cell and/or the second solar cell formed after cutting has a reduced current and reduced power consumption in the module.

Wherein, the first type of solar cell and the second type of solar cell are p type of and/or n type of solar cells. The electrical performance of these solar cells is as consistent as possible. The smaller the current error fluctuation range of the maximum power point, the better, at least within 0.2 A. The metalized version of these cells is also different according to the type of cell.

According to some embodiments of the present invention, a solar cell string is formed by connecting a plurality of the first type of solar cell in series with each other and then connecting a piece of the second type of solar cell; or formed by connecting a plurality of the first type of solar cell in series with each other and then connecting the second type of solar cell and continuing to serially/parallel connect the first type of solar cell; or formed by connecting a plurality of the first type of solar cell and the second type of solar cell alternately. The alternate connection mentioned here includes not only one first type of solar cell, one second type of solar cell, one more first type of solar cell, and one second type of solar cell. After the first type of solar cell is connected, one second type of solar cell is then connected, and then the first type of solar cell of any wafer is connected, and so on.

Further, the plurality of first type of solar cells (701) are connected in series with each other: wherein one of the back electrodes of the first type of solar cell covers the front electrodes of the adjacent one of the first type of solar cells (701). A conductive material is provided between the back electrode and the front electrode covered; further, the connection between the first type of solar cell and the second type of solar cell is: the front electrode of the first type of solar cell is connected to the positive electrode or the negative electrode of the back electrode of the second type of solar cell to form a parallel or series connection, respectively, and a conductive material is provided between the connected front electrode and back electrode.

Specifically, in the connection between the first type of solar cells, the back electrode of one of the first type of solar cells covers the front electrode of the adjacent one of the first type of solar cells, and a conductive material is provided between the back electrode and the front electrode covered with each other, and the electrodes are in good contact with each other through the conductive material, so as to repeatedly form the solar cell alternately.

The connection between the first type of solar cell and the second type of solar cell is that the front electrode of the first type of solar cell is connected to the back electrode of the second type of solar cell, and a conductive material is provided between the connected front electrode and back electrode; the electrodes also form good contact through the conductive material.

The connection between the first type of solar cell and the second type of solar cell may be a series connection or a parallel connection according to the circuit design, and there may be a combination of series connection and parallel connection in the same series of cell strings.

Where the connection between the first type of solar cell and the second type of solar cell is in series or parallel, and when the polarity of the connection electrode of the first type of solar cell and the second type of solar cell is the same, the connection between the first type of solar cell and the second type of solar cell is parallel connection; when the polarity of the connection electrode of the first type of solar cell and the second type of solar cell is opposite, the connection between the first type of solar cell and the second type of solar cell is a series connection.

That is to say, the solar cell string according to the embodiment of the present invention uses shingled connection. At this time, the adjacent two cells in the cell string are connected by shingling manner, which can lead the current derivation unit out of the back of the cell, and reduce the difficulty of incorporating the diode, without increasing the area of the module, and also reducing the solar cell breakage rate, thereby improving module passed yield and module efficiency.

Wherein, the conductive material is preferably one or more of conventional conductive tape, conductive adhesive, conductive adhesive film, conductive paste and solder paste.

According to some embodiments of the present invention, at least one of the first type of solar cell has a first current derivation unit on the back side, and at least one of the second type of solar cell has a second current derivation unit on the back side.

Optionally, the first current derivation unit and the second current derivation unit are welding strips, and all of the welding strips are led out from the back of the first and second solar cells and are provided with lead wires.

The first current derivation unit and the second current derivation unit of the present invention are preferably welding strips (may also be called bus bars), and all the welding strips are led out from the backs of the first type of solar cell and the second type of solar cell, and the lead wires are reserved.

The reserved lead wire is bonded to the first type of solar cell and the second type of solar cell by welding or conductive material.

The welding strip can be a common welding strip or a welding strip with a specific insulation pattern. The welding between the welding strip and the cell can be high temperature welding or bonding using a conductive material; the conductive material can be one or more of a metal welding strip, conductive tape, conductive adhesive, conductive adhesive film, conductive paste and solder paste etc.

Wherein, the positive electrode and the negative electrode on the back side of the second type of solar cell are phase insulated. In addition, the front side of the second type of solar cell may be provided with an electrode or no electrode.

When an electrode is provided, the electrode is led to the back side of the second type of solar cell through a perforation to form the same polarity as the front side electrode.

As a preferred embodiment of the present invention, the front electrode or the back electrode of the first type of solar cell and the second type of solar cell of the present invention may be a continuous main grid line or a discontinuous dot type of main grid or a discontinuous line type of main grid line.

The back main grid of the first type of solar cell may be a main grid located at a position close to the side edge of the back side of the first type of solar cell, or may be further, the back main grid of the first type of solar cell may further include a main grid located near the side edge of the backside and a middle main grid located in the middle of the backside.

Similarly, the back main grid of the second type of solar cell may be a main grid located at a position close to the side edge of the back side of the second type of solar cell, or may be further, the back main grid of the second type of solar cell may further include a main grid located near the side edge of the backside and a middle main grid located in the middle of the backside.

The above second object of the present invention is achieved by the following technical solution: a solar cell string group formed by connecting a plurality of solar cell strings as described in any one of the above. According to the design, multiple solar cell strings can be connected in series or in parallel.

The above third object of the present invention is achieved by the following technical solutions:

A solar cell module comprising a cover plate, a first encapsulating film, a solar cell string group, a second encapsulating film, a back plate material in order from the light receiving surface to the backlight surface, and the solar cell string group is the above-mentioned solar cell string group.

The cover sheet of the solar cell module of the present invention is usually glass, the first encapsulating adhesive film and the second encapsulating adhesive film are usually EVA, POE, PVB, ion cross-linked film, etc., the back sheet is usually a fluorine-containing back sheet, the fluorine film materials are PVF, PVDF and ETFE, etc. Common back planes are TPT, TPE, KPK, KPE and fluorine-free back planes such as PET, PA and glass, etc.

EVA is the abbreviation of ethylene-vinyl acetate copolymer.

POE is the abbreviation of Polyolefin Elastomer.

PVB is the abbreviation of PolyVinyl Butyral Film.

TPT (polyvinyl fluoride composite film), the fluorine-containing material on both sides is TEDLAR polyvinyl fluoride polymer PVF produced by DuPont, the middle is PET (the abbreviation of Polyethylene terephthalate), which is compounded together by adhesive; namely TEDLAR+PET+TEDLAR, hence the name TPT.

TPE is the abbreviation of monofluoro film+PET+EVA film.

KPK is also a double-sided fluorine-containing back plate. Unlike TPT, its fluorine material manufacturer is Kynar PVDF produced by Arkema France.

KPE is the abbreviation of monofluoro film+PET+EVA film.

PA is a polyamide commonly known as Nylon, the abbreviation of Polyamid eP, it is a general term for polymers containing amide groups in the repeating unit of the main chain of the macromolecule.

The above fourth object of the present invention is achieved by the following technical solution: the method for preparing the above solar cell module includes the following steps:

(1) providing the first type of solar cell and the second type of solar cell, wherein the front electrodes of the first type of solar cells have the same polarity, and the back electrodes of the first type of solar cells have the same polarity. The polarity of the front electrode of the first type of solar cell is opposite to the back electrode thereof, and the back electrode on the back side of the second type of solar cell includes positive electrode and negative electrode;

(2) connecting a plurality of the first type of solar cell in series, and further connecting with the second type of solar cell so as to form a cell string;

(3) parallel connecting said first type of solar cells of different cell strings by the first current derivation unit on the back and setting the lead wire aside, parallel connecting said second type of solar cell of different cell strings by the second current derivation unit on the back and setting the lead wire aside, thereby a plurality of the cell strings are connected to form a cell string group;

(4) laying the cover plate, the first encapsulating film, the cell string group, the second encapsulating film, and the back plate in this order from the light-receiving surface to the backlight surface;

(5) conducting EL test and lamination post-processing procedures after completion of laying;

(6) soldering junction boxes and the diodes at each lead wire set aside to obtain the solar cell module.

Compared with the prior art, the present invention has the following advantages:

(1) the method of the present invention can reduce the internal transmission loss of the module and enhance the ability of the module to resist hot spots by designing and using two different structures of the cell at the same time, forming the cell string by using the shingled connection, and then connecting them in parallel. There is no need to increase the module area, and even on the basis of reducing the module area, all solar cells can form a serial-parallel serial parallel circuit;

(2) the method of the present invention manufactures cell strings by matching cells with different structures, and the second solar cell can simply realize parallel connection between cell strings, which simplifies the parallel process between cell strings and reduces the difficulty of incorporating diodes, thereby reducing the debris rate of solar cells, improving passed yield, module efficiency and hot spot resistance;

(3) the method of the present invention can continue to reduce the area of the solar cell by optimizing the interconnection between cell strings, and at the same time can produce cell strings of any length. Compared with conventional shingled modules, the method of the present invention can reduce the size requirements of the glass of the module, increase the efficiency of the module and reduce the installation cost.

BRIEF DESCRIPTION OF THE DRAWINGS

In order to explain the technical solutions more clearly in the embodiments of the present invention, the drawings required in the description of the embodiments will be briefly introduced below.

The reference signs in the figures indicate as follows:

101, cover plate material; 201, first encapsulating film; 301, cell string group; 401, second encapsulating film; 501, back plate material; 601, cell string; 701, the first type of solar cell; 801, the second type of solar cell; 901, the first current derivation unit; 902. the second current derivation unit.

1. The front main grid of the first type of solar cell a (A-I type of solar cell); 2. The back main grid of the first type of solar cell a; 3. The front main grid of the second type of solar cell b; 4. The back main grid of the second type of solar cell b (B-I type of solar cell); 5. The electrode of the second type of cell b has the same polarity as the front electrode; 6. The back main grid of the second type of solar cell b; 7. Welding Belt (combination belt); 10, The front main grid of the first type of solar cell a'(A-II type of solar cell); 11, The back main grid of the first type of solar cell a; 12, The back middle bus bather of the first type of solar cell a'; 13, The back main bar of the second type of solar cell b' (B-II type of solar cell); 14, The middle back main bar of the second type of solar cell b'; 15, The back main grid with the same polarity as the back of the second type of solar cell b" (B-III type of solar cell); 16. The middle back main grid with the same polarity as the front side of the second type of solar cell b"; 17. The back main grid with the same polarity as the front side of the second type of solar cell b"; 18, Two front main grids of the first slit cell 2a'; 19, The back main grid of the first slit cell 2a' (A-III type of solar cell); 20. The back main grid of back-contact slit cell 2b"; 21, The back main grid of back-contact slit cell 2b".

DETAILED DESCRIPTION

The present invention will be described below with specific embodiments.

Embodiment 1

Figure 1:
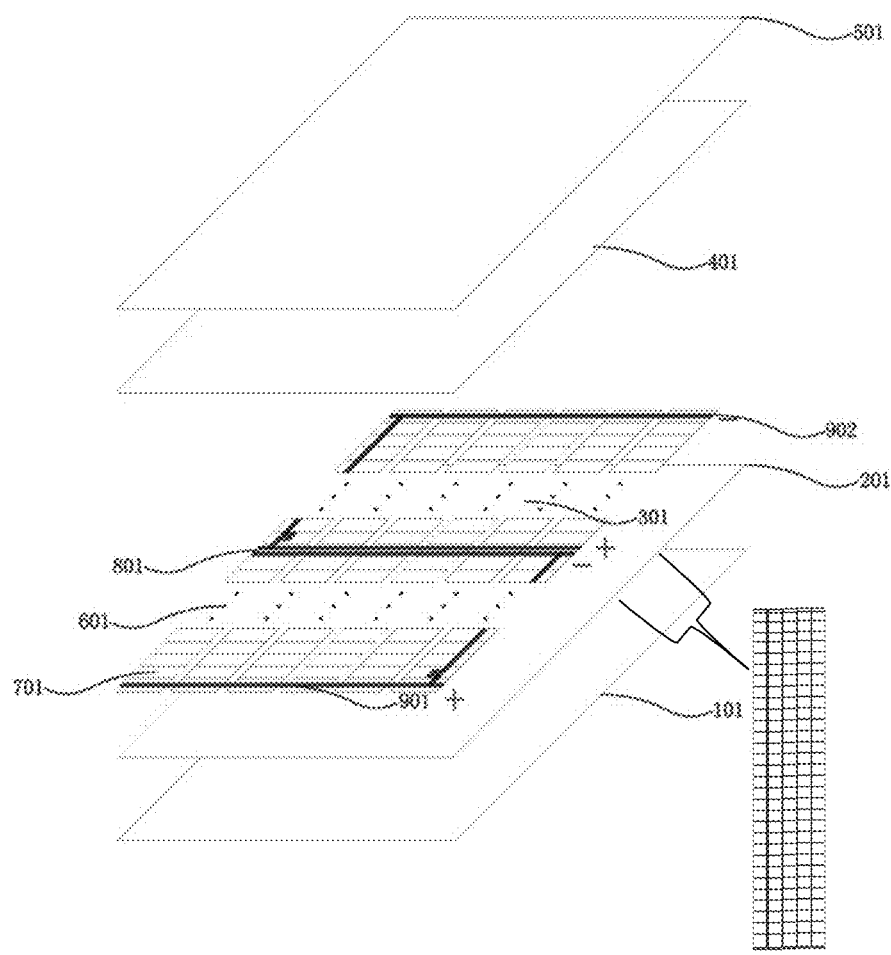
FIG. 1 is a schematic structural view of a solar cell module according to an embodiment of the present invention.

FIG. 1 is a schematic structural diagram of a solar cell module in Embodiment 1 of the present invention.

As shown in FIG. 1, the solar cell module provided in this Embodiment includes, in order from the light receiving side to the backlight side (from bottom to top in FIG. 1): cover plate 101, first encapsulating film 201, and cell string group 301, the second encapsulating film 401, back plate 501. It should be noted that the light receiving side is also referred to as the front side, and the backlight side is also referred to as the back side.

The cell string group 301 is formed by connecting a plurality of cell strings 601. Overall, the cell string group 301 includes a plurality of solar cells in an array. Each solar cell string 601 includes a plurality of first type of solar cells 701, one second type of solar cell 801, and a plurality of first type of solar cells 701 which are electrically connected in series in this order. More specifically, in FIG. 1, the cell string group 301 is formed by connecting six cell strings 601, and each cell string 601 includes six or more the first type of solar cell 701 and one that are electrically connected in series in sequence, one second type of solar cell 801 and six or more first type of solar cells 701.

In addition, please refer to the lower half of the cell string group 301 indicated by reference symbol M in FIG. 1. In the lower half of the cell string group 301 shown by reference symbol M, each cell string 601 is formed by connecting a plurality of first type of solar cells 701 and one second type of solar cell 801. Among them, the polarities of the front electrodes of the plurality of first type of solar cells 701 are the same, and the polarities of the back electrodes of the plural first type of solar cells 701 are also the same. In addition, the front electrodes of the plurality of first type of solar cells 701 and the back electrodes of the plurality of first type of solar cells 701 have opposite polarities, and the back electrodes on the back of the second type of solar cells 801 include a positive electrode and a negative electrode. In the lower half of the cell string group 301 shown by reference symbol M, for each cell string 601, the back electrode of the first type of solar cell 701 (for example, the first type of solar cell 701 in the lower left corner of the cell string group in the form of an array) is a positive electrode, the front electrode of the first type of solar cell 701 is a negative electrode. The front electrode (negative electrode) of the first type of solar cell 701 and the back electrode (positive electrode) of the second first type of solar cell 701 are connected in a shingled manner. The front electrode (negative electrode) of the second first of solar cell 701 and the back electrode (positive electrode) of the third first type of solar cell 701 are shingled. The front electrode (negative electrode) of the n-lth first type of solar cell 701 and the back electrode (positive electrode) of the nth first type of solar cell 701 are connected in a shingled manner . . . in order to form a shingled cell string structure, and a front electrode (negative electrode) of a first type of solar cell 701 before a second type of solar cell 801 is connected to a back electrode (positive electrode) of a second type of solar cell 801.

Then, please refer to the upper half of the cell string group 301 in FIG. 1, that is, the upper half opposite to the lower half shown by M. The other back electrode (negative electrode) of the second type of solar cell 801 is connected to the front electrode (positive electrode) of another first type of solar cell 701 in a shingled manner, and then the back electrode (negative electrode) of the other first type of solar cell 701 and the front electrode (positive electrode) of the next first type of solar cell 701 are connected in a shingled manner . . . The negative electrode on the back of the last first type of solar cell 701 is exposed.

Through the above ways, one cell string 601 connected in series is formed. The cell string 601 includes six or more first type of solar cells 701, one second type of solar cell 801, and six or more first type of solar cells 701 which are electrically connected in series in this order.

The cell string 601 formed as described above is in the form of electrical connection in series. When the current needs to be led out, the positive poles of all the first type of solar cells 701 of the six side-by-side cell strings 601 can be led out from the back side to the side of the solar cell module by the first current derivation unit 901, and at the same time, all the last negative electrodes of the first type of solar cell 701 of the 6 side-by-side cell strings 601 are led out from the back to the side of the solar cell module by the second current derivation unit 902. At the same time, all the positive electrodes and negative electrodes of the second type of solar cell 801 in the middle of the six side-by-side cell strings 601 are led out from the back side to the side of the solar cell module by the first current derivation unit 901 and the second current derivation unit 902. Besides, the positive and negative main grids for leading current on the back side of the second type of solar cell 801 may be located in the middle or on the side of the back side of the second type of solar cell 801. It can be seen that in this embodiment, both the first current derivation unit 901 and the second current derivation unit 902 are led from the back of the solar cell module. For example, when the first current derivation unit 901 and the second current derivation unit 902 are solder tapes or bus bars, they will not form a shield to the front of the cell of the solar cell module. Moreover, both the first current derivation unit 901 and the second current derivation unit 902 are located below the solar cell, and do not extend outside the solar cell (solar cell string). Therefore, the installation area of the solar cell module can also be saved, more solar cells are arranged in a limited area.

It should be noted that, by adjusting the arrangement and arrangement of the positive and negative electrodes of the first type of solar cell 701 and the second type of solar cell 801, the cell string 601 formed as described above can be connected in parallel.

In the present invention, the first type of solar cell 701 and the second type of solar cell 801 are elongated solar cells, usually rectangular solar cells. For example, the rectangular solar cell can be formed by bisection cutting, trisection cutting, quartering cutting, five-division cutting and six-division cutting, etc. the square solar cells (called a silicon wafer before making the solar cell). In this embodiment, the commonly used cutting method is five-division cutting.

Figure 2:
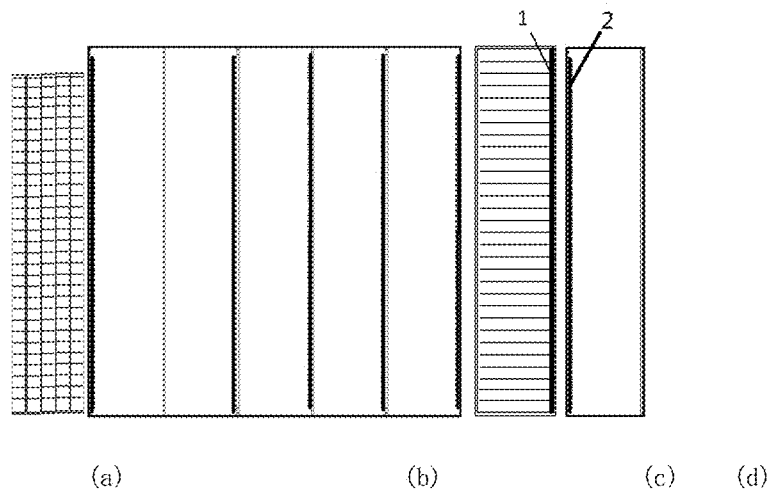
FIG. 2 is a schematic diagram of the first solar whole solar cell A before and after cutting in embodiment 1-4, wherein (a): front side of A before cutting, (b): back side of A before cutting, (c): front side of a after cutting (A-I type of solar cell), (d): back side of a' after cutting.

Please refer to FIG. 2, which is a schematic diagram of the first type solar whole solar cell A (square) before and after cutting in embodiment 1, wherein (a): The front side of the first type solar whole solar cell A before cutting, (b): The back side of the first type solar whole solar cell A before cutting, (c): The front side of the first type of solar cell A after cutting a (A-I type of solar cell), (d): The back side of the first type of solar whole solar cell A after cutting. As shown in FIG. 2(c) and FIG. 2(d), the cut a (A-I type of solar cell) has the front main grid 1 of the first type of solar cell a and the back main grid 2 of the first type of solar cell a. For example, the front main grid 1 of the first type of solar cell a is a negative electrode, and the back main grid 2 of the first type of solar cell a is a positive electrode. The first type of solar cell is a conventional solar cell, that is, the positive electrode and the negative electrode are located on the front and back of the cell respectively.

Figure 4:
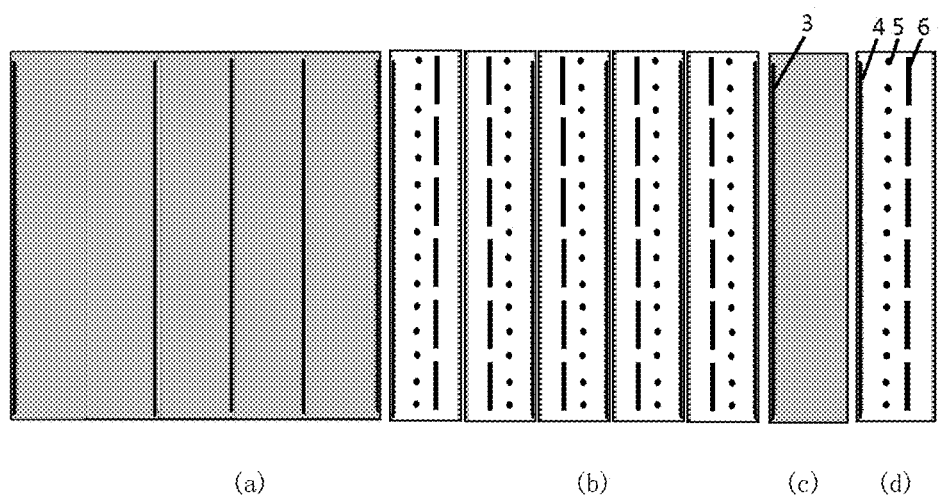
FIG. 4 is a schematic diagram of the whole back-contact cell B before and after cutting in embodiment 1, wherein (a): front side of B before cutting, (b): back side of B before cutting, (c): front side of b (B-I type of solar cell) after cutting, (d): back side of b after cutting.

The second type of solar cell can be a back-contact cell. For example, the front side of the second type of solar cell may be provided with a front electrode (for example, MWT structure), or may not be provided with a front electrode (for example, IBC structure). Please refer to FIG. 4, FIG. 4 is a schematic diagram of the back-contact whole solar cell B before and after cutting in embodiment 1, wherein (a): The back-contact whole solar cell B before cutting, (b): The back-contact whole solar cell B before cutting and back, (c): The front side of the b (B-I type of solar cell) of the back-contact whole solar cell B after cutting, (d): the back side of b of the back-contact whole solar cell B after cutting. This kind of second type of solar cell (B-I type of solar cell) includes the front type main grid 3 of the second type of solar cell b, the back type main grid 4 of the second type of solar cell b (B-I type of solar cell), and the electrode of the same polarity as the back electrode and the front electrode of the second type of solar cell b, and the back main middle grid 6 of the second type of solar cell b. In this embodiment, two current derivation units can be led out from the electrode or the main grid on the back side by using a solder tape or a bus bar.

Figure 5:
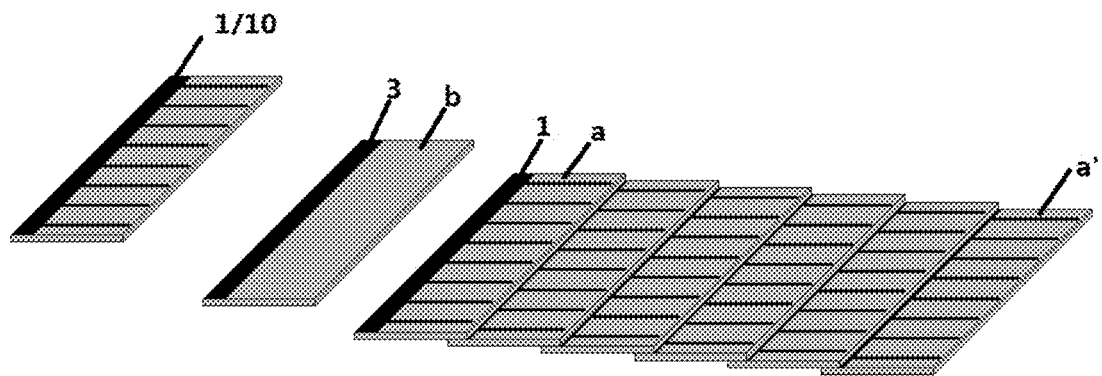
FIG. 5 is a schematic diagram of solar cells by series connection in embodiments 1-4.

Please refer to FIG. 5, which is a schematic diagram of a series of cell strings in embodiment 1. First, the first type of solar cell a (A-I type of solar cell) is connected in series, then in series with the second type of solar cell b, and then the second type of solar cell b is connected in series with the first type of solar cell a (A-I type of solar cell).

Figure 3:
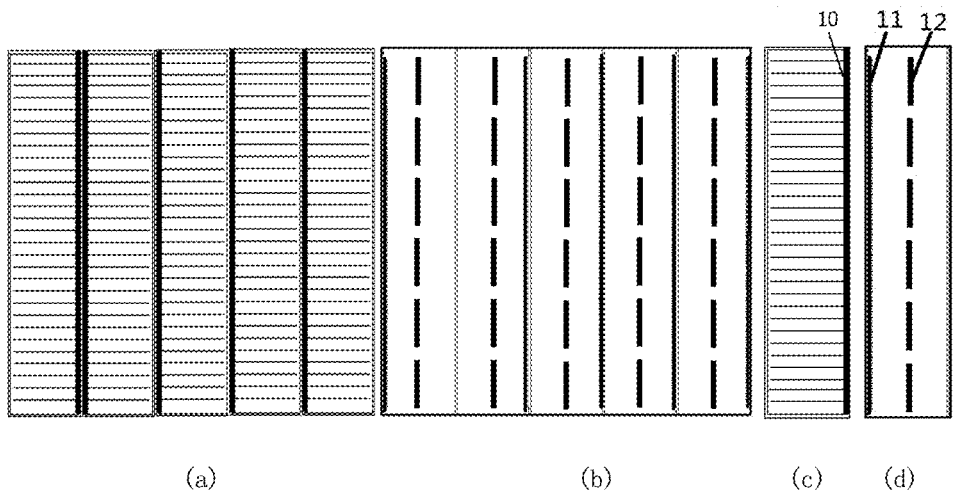
FIG. 3 is a schematic diagram of the first whole solar cell A' with two main grids on the back side before and after cutting in embodiment 1-4, wherein (a): front side of A' before cutting, (b): back side of A' before cutting, (c): front side of a' after cutting (A-II type of solar cell), (d): back side of a' after cutting.

In one embodiment, as shown in FIG. 5, the first type of solar cell may include a plurality of A-I type of solar cells a, and at least one A-II type of solar cell a' (as shown in FIG. 3). The A-II type of solar cell a' has two back electrodes, one of the back electrodes is located at the edge of the back of the class A-II type of solar cell, and the other back electrode is located in the middle of the back side of the solar cell, as described later in the preparation method, both the positive electrode and the negative electrode can be drawn from the back side of the cell. Specifically, as shown in FIG. 3, the front type main grid 10 of the first type of solar cell a'(A-II type of solar cell) includes the first type of solar cell a'(A-II type of solar cell) and the back main grid 11 of the first type of solar cell a', and the central grid 12 at the back of the first type of solar cell a'.

Referring to FIG. 1, correspondingly, at least one of the plurality of first type of solar cells 701 has a first current derivation unit 901 on the back side, and at least one second type of solar cell 801 has a second current derivation unit 902 on the back side.

Designed in this way, using, for example, conductive adhesive between adjacent cells for electrical connection, it is possible to simultaneously connect the front and back sides of two adjacent cells without using a bus bar (welding strip), which can effectively increase the production speed and efficiency, reducing the wafer breakage rate during module production. At the same time, on the basis of ensuring the hot spot resistance of the module, the effective utilization rate of the module area is increased, and the power generation efficiency of the module is increased.

As shown in FIG. 2, the front and back sides of the whole solar cell before the first type of solar cell are provided with main grids respectively, and the whole solar cell is cut near the reserved position of the main grid to form a plurality of first type of solar cell, the main grid is distributed on the long edge of the first type of solar cell, and is perpendicular to the short edge of the first type of solar cell.

The first type of solar cell can also have another structure. As shown in FIG. 3, the front and back side of the full cell of the first type of solar cell before cutting are provided with main grids respectively. Cut the full solar cell near the reserved position of the main grid to form multiple first type of solar cells, the main grid is distributed on the long edge of the first type of solar cell, and is perpendicular to the short edge of the first type of solar cell. There are two types of main grids on the back, one of which is a continuous line segment structure, and the other main grid is a discontinuous line segment structure.

As shown in FIG. 4, the front and back of the full wafer of the second type of solar cell before cutting are respectively provided with main grids, and the main grids of the positive and negative poles are also on the back. Cut the full solar cell near the reserved position of the main grid to form multiple second type of solar cells, the second type of solar cell has a main grid on the upper side of the front and back sides, and there are other positive and negative electrodes on the back of the second type of solar cell. The electrodes are perpendicular to the short edge of the solar cell.

As shown in FIG. 5, when the first type of cut solar cell are connected in series with each other, the connection between adjacent two solar cells is connected in series by shingling. One of the back grids of a solar cell is arranged on the front grid of an adjacent solar cell, and a conductive material (such as conductive adhesive) is provided at the position where the back grid and the front grid are in contact.

Figure 6:
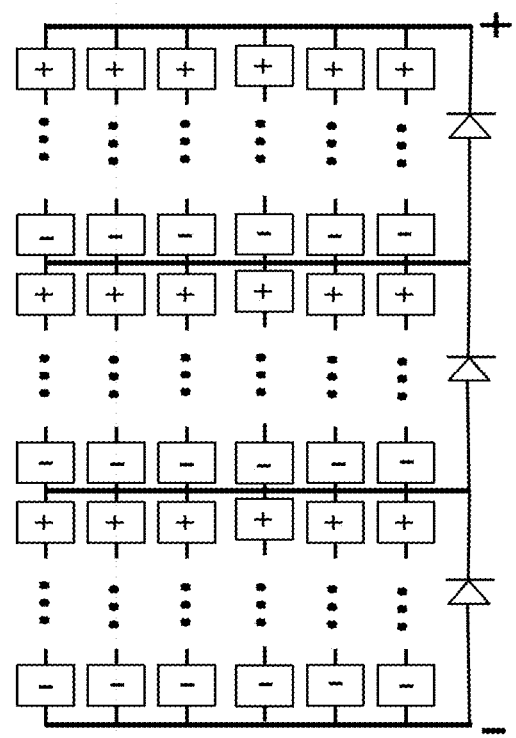
FIG. 6 is a circuit schematic diagram of modules in embodiments 1-2.

FIG. 6 is a circuit schematic diagram of the modules of embodiment 1. As shown in FIG. 6, after the first type of solar cell is connected in series to a certain number (1~40 pcs), a second type of solar cell is connected in series. When the second type of cell and the first type of solar cell are connected in series with each other, the two solar cells adjacent with each other are connected in series by shingling method, the main grid on the edge of back side of the second type of solar cell is arranged on the front main grid of the adjacent one of the first type of solar cells. Then continue to serially connect the first type of solar cell to the cell string where the second type of solar cell is located. When connecting in series, the connection between two adjacent cells is also connected in series using a lamination method. Set on the main grid of the front long edge of the adjacent second type of small solar cell, and then connect a certain number of the first type of small solar cells (0~40), and then connect the second type of small solar cells as needed, as the cycle way to get the required cell string.

A conductive material is provided at the position where the back main grid contacts the front main grid.

Figure 7:
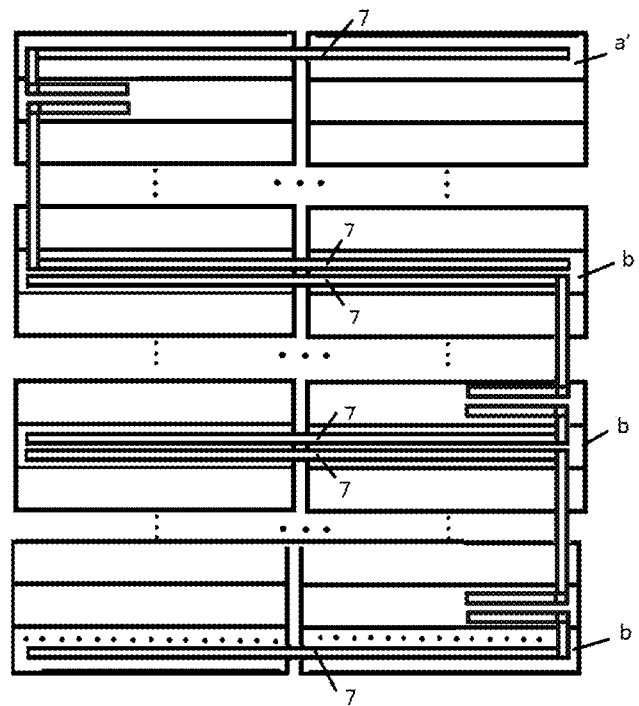
FIG. 7 is a schematic diagram of the back structure and connection of the cell string in Embodiment 1.

FIG. 7 is a schematic diagram of the back structure and connection of the cell string in Embodiment 1. As shown in FIG. 7, use a bus bar to connect all cell strings in parallel. Then use a bus bar to weld the positive electrode on the back of the second type of cell in all cell strings, and then use a bus bar to weld the negative electrode on the back of the second type of cell in all strings. The second type of cell is connected in parallel and leads are left.

The bus bar may be provided with an insulating pattern according to the specific conditions of the cell main grid.

The back electrode of the second cell can be dot-shaped, elliptical, rectangular, or a continuous grid line. The welding method may also be heating welding or double-sided conductive material welding.

Specifically, the manufacturing method of the above solar cell module may include the following steps.

Figure 17:
FIG. 17 is a schematic diagram of the bus bar in Embodiment 1 and Embodiment 4.

In this embodiment, the first type of solar cell (conventional solar cell) and the second type of solar cell (back-contact solar cell) are combined to produce a module. After the two cells are cut, they are welded into a string using shingling method. The inter-segment is connected in parallel on the back of the back-contact cell to form a serial-parallel serial parallel circuit, and a diode is connected in parallel in an appropriate position in the circuit to produce a module. The specific steps are as follows:

selecting the solar cell A, and cut the solar cell A into 5 first type of solar cells a. (a), (b), (c), (d) of FIG. 2 are schematic diagrams before and after cutting the first type of solar cell, wherein (a) is the front of the solar cell before cutting, (b) is the back of the solar cell before cutting, (c) is the front of the solar cell after cutting, and (d) is the back of the solar cell after cutting;

(2) selecting another solar cell A' with a back electrode structure, and cut the solar cell A' into 5 first type of solar cells a'. (a), (b), (c), (d) of FIG. 3 are schematic diagrams before and after cutting the cell, wherein (a) is the front of solar cell before cutting, (b) is the back of the solar cell before cutting, (c) is the front of the solar cell after cutting, (d) is the back of the solar cell after cutting;

(3) selecting the back-contact solar cell B, and cut the back-contact solar cell B into 5 second type of solar cells b. (a), (b), (c), (d) of FIG. 4 are schematic diagrams before and after cutting the solar cell, wherein (a) is the solar cell before cutting, (b) is the back of the solar cell before cutting, (c) is the front of the solar cell after cutting, (d) is the back of the solar cell after cutting;

welding solar cell string: take a piece of the first type of solar cell a', check the appearance of the cell, apply conductive adhesive to the front grid 10 of the first type of solar cell a', and then take another piece of the first type of solar cell a. Also check the appearance of the solar cell. Apply conductive adhesive to the front main grid 1 of the first type of solar cell a. Superpose the back main grid 2 of the first type of solar cell a and the front main grid 10 of the first type of solar cell a' with conductive adhesive, then heat welding. The entire welding process can be completed in the automatic string welding machine;

A plurality of cut first type of solar cells a are connected in series to 30p, and then a second type of solar cell b is added, and the second type of solar cell b is checked for appearance, and apply conductive adhesive to the front grid 3 of the second type of solar cell b. Superpose the back main grid 4 of the second type of solar cell a and the front main grid 1 of the first type of solar cell a with conductive adhesive, then heat welding. Then continue to connect the first type of solar cell a, superpose the back main grid 2 of the first type of solar cell a and the front main grid 3 of the second type of solar cell b with conductive adhesive, then heat welding. In this way, a required cell string including a plurality of (one more) back-contact cells is formed. Multiple cell strings are connected to form a cell string group;

connecting multiple cell strings in parallel, and use the bus bar 7 to connect the main grid 12 at the back of the first type of solar cell a' of the six cell strings and leave the lead wire. Using the bus bar 7 with an insulating group on the back, the back of the second type of solar cell b between different strings is connected in parallel with the main grid 5 of the same polarity of the front electrode and the lead is left, as shown in FIG. 7;

FIG. 6 is a circuit diagram of the module; FIG. 17 is a form of the bus bar 7. The white is in contact with the negative electrode on the back of the cell, and the black insulating part is in contact with the back of the cell;

laying the cover plate material, EVA and/or POE, cell string, EVA and/or POE, and back plate material in order from top to bottom;

conducting EL test and lamination post-processing procedures after completion of laying;

soldering junction boxes with diodes between lead wires according to the circuit diagram to obtain the shingled solar cell module.

Embodiment 2

The structure of the solar cell module provided by this embodiment is the same as that of embodiment 1, as shown in FIG. 1.

The first type of solar cell is a conventional cell. The conventional cell is the same as in embodiment 1. As shown in FIGS. 2 and 3, the front and back of the first type of solar cell are provided with main grids respectively. The solar cells are cut near the reserved position of the main grid to form a plurality of first type of solar cells. The main grid is distributed at the long edge of the first type of solar cells and is perpendicular to the short edge of the first type of solar cells.

Figure 8A:
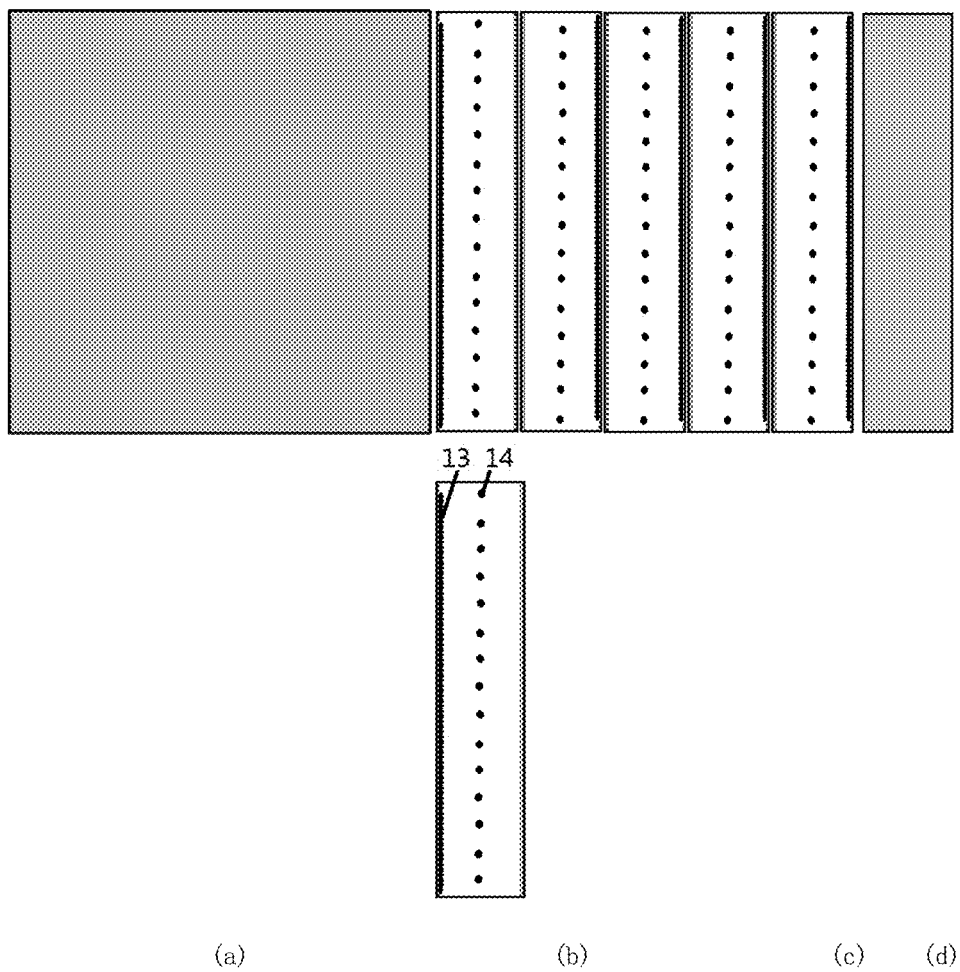
FIG. 8a is a schematic diagram before and after cutting the whole back-contact cell B5 of Embodiment 2 and 4 which has only one electrode on the back and the same front electrode and the electrode is located in the middle of the back. Wherein (a): front side of B5 before cutting, (b): back side of B5 before cutting, (c): front side of B5 (B-II type of solar cell) after cutting, (d): back side of b' after cutting.
Figure 8B:
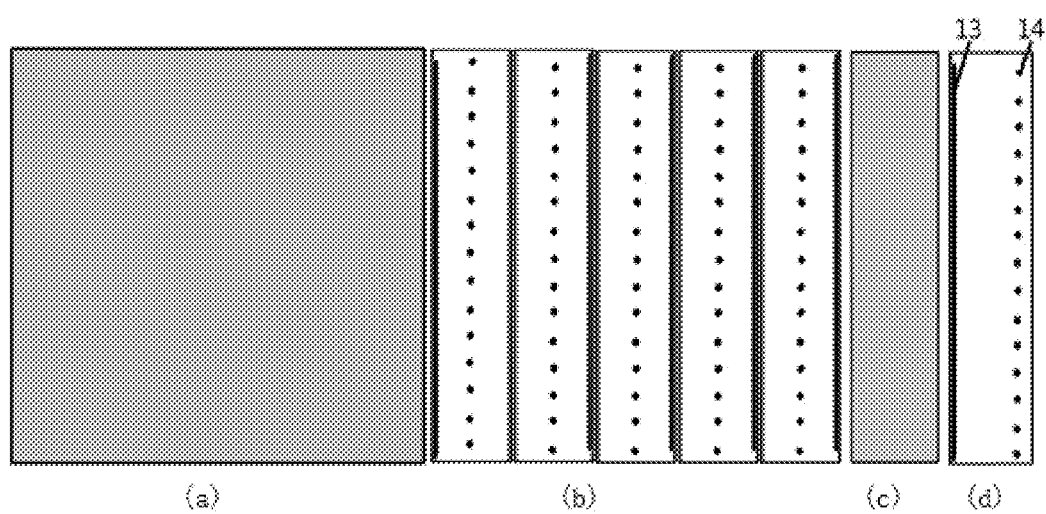
FIG. 8b is a schematic diagram before and after cutting the whole back-contact cell B5 of Embodiment 2 and 4 which has only one electrode on the edge of back and the same as the front electrode and the electrode is located in the middle of the back. Wherein (a): front side of B5 before cutting, (b): back side of B5 before cutting, (c): front side of b5 (B-II type of solar cell) after cutting, (d): back side of b' after cutting.

As shown in FIGS. 8a and 8b, the second type of solar cell is a back-contact solar cell. The front side of the back-contact solar cell is not provided with electrodes, and the positive and negative electrodes of the back-contact solar cell are both provided on the back of the back-contact solar cell.

Cut the whole back-contact cell before cutting at the reserved position near the main grid on the back to form a plurality of second type of solar cells b'. The main grid is distributed on the upper side of the back side of the second type of solar cells b'. In the middle, there is a main grid with the same polarity as the front, and all the main grids are perpendicular to the short edge of the second type of solar cell.

Figure 9:
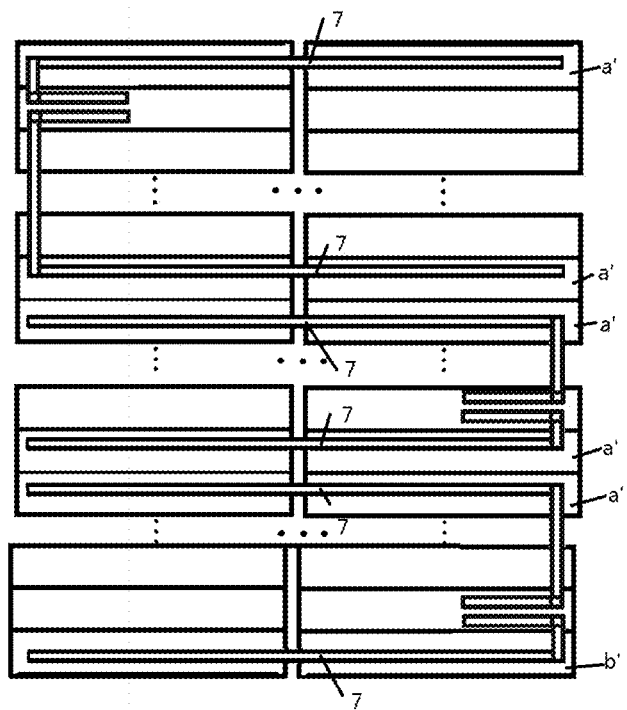
FIG. 9 is a schematic diagram of the back structure and connection of the cell string in Embodiment 2.

In this embodiment, a conventional solar cell and a back-contact solar cell are combined to produce a module. After the two cells are cut, they are welded into a string by shingling, and the cell strings are segmented in parallel on the back of the back-contact cell to form a string-parallel-string parallel circuit, and diodes are connected in parallel in appropriate places in the circuit to make components, the specific steps are as follows:

(1) selecting the solar cell A, and cut the solar cell A into five first type of solar cells a, and (a), (b), (c), and (d) of FIG. 2 are the 7K intentions before and after the cell cutting;

(2) selecting the first type of solar cell A', and cut the first type of solar cell A' into 5 first type of solar cells a', as shown in FIG. 3, (a), (b), (c), (d) are schematic diagrams before and after cutting the cell;

(3) selecting the back-contact solar cell B', and cut the second type of cell B' into 5 second type of solar cells b', (a), (b), (c), (d) of FIGS. 8a and 8b are schematic diagrams before and after cutting the solar cell;

(4) welding solar cell string: take a piece of the first type of solar cell a', check the appearance of the cell, apply conductive adhesive to the front grid 10 of the first type of solar cell a', and then take another piece of the first type of solar cell a. Superpose the back main grid 2 of the first type of solar cell a and the front main grid 10 of the first type of solar cell a' with conductive adhesive, then heat weld. The entire welding process can be completed in the automatic string welding machine;

A plurality of cut first type of solar cells a are connected in series to 30*p*, and then a first type of solar cell a is added. Superpose the back main grid 11 of the first type of solar cell a' and the front main grid 1 of the first type of solar cell a with conductive adhesive, then heat welding. Then continue to connect the first type of solar cell a', Superpose the back main grid 11 of the first type of solar cell a' and the front main grid 10 of the first type of solar cell a' with conductive adhesive, then heat welding. Then continue to connect the first type of solar cell a in series; after cycling to the desired length in this way, string it into the second type of solar cell b'. Superpose the back main grid 13 of the second type of solar cell b' and the front main grid 1 of the first type of solar cell a with conductive adhesive, then heat welding. In this way, a cell string including a back-contact cell is formed;

connecting multiple cell strings in parallel, and use the bus bar 7 to connect the main grid 12 at the back of the first type of solar cell a' of the six cell strings and leave the lead wire. Using the bus bar 7 with an insulating group on the back, the back side main grid 14-middle main grid (the second type of solar cell shown in FIG. 8*a*) or the back side main grid 14-edge main grid (the second type of solar cell shown in FIG. 8*b*) of the second type of solar cell b' between different strings are connected in parallel on the back side and the leads are left, as shown in FIG. 9;

laying the cover plate material, EVA and/or POE, cell string, EVA and/or POE, and back plate material in order from top to bottom;

conducting EL test and lamination post-processing procedures after completion of laying;

soldering junction boxes with diodes between lead wires according to the circuit diagram to obtain the shingled solar cell module.

Embodiment 3

The structure of the solar cell module provided in this embodiment is the same as that in embodiment 1.

As shown in FIG. 2, the front and back sides of the first type of solar cell are respectively provided with a main grid, and the first type of solar cells are cut near the reserved position of the main grid to form a plurality of first type of solar cells. The main grids are distributed in the long edge of the first type of solar cell and is perpendicular to the short edge of the first type of solar cell.

Figure 10:
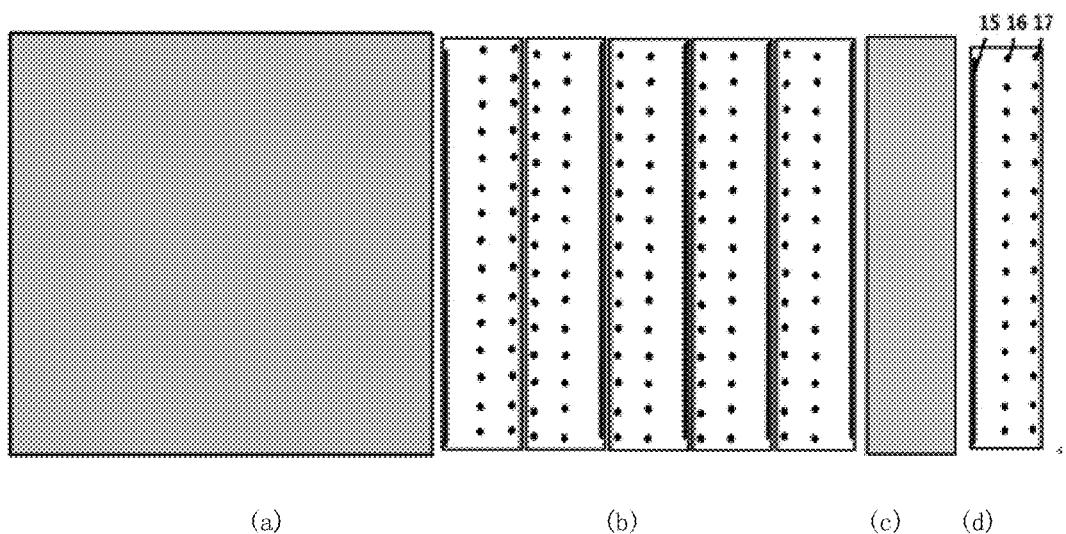
FIG. 10 is a schematic diagram of the whole back-contact cell B" before and after cutting of the back-contact cell in Embodiment 3, Wherein (a): front side of B" before cutting, (b): back side of B" before cutting, (c): front side of b" (B-II type of solar cell) after cutting, (d): back side of b" after cutting.

As shown in FIG. 10, the second type of solar cell is a back-contact solar cell. The front side of the back-contact solar cell is not provided with electrodes. The positive and negative electrodes of the back-contact solar cell are both provided on the back of the back-contact solar cell. The solar cells are cut near the reserved position of the back main grid to form a plurality of second type of solar cells b". The second type of solar cell b" has a main grid on the upper side of the other side. There are main grids with the same polarity as the front side in the middle and the other side, and all the main grids are perpendicular to the short edge of the second type of solar cell.

Figure 11:
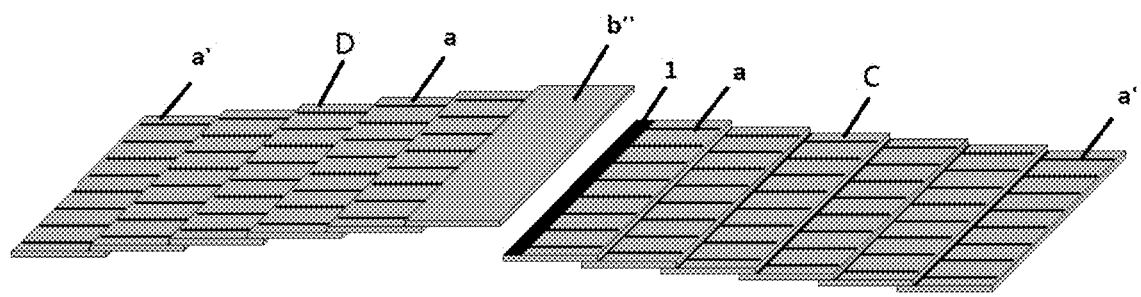
FIG. 11 is a schematic diagram of 7K cells connected in series and parallel in Embodiment 3.

As shown in FIG. 11, when the cut first type of solar cells are connected in series with each other, the connection between two adjacent solar cells is connected in series by shingling manner, in which the back main grid of one of the solar cells is arranged on the front main grid of the adjacent one of the solar cells, and a conductive material is provided at a position where the back main grid contacts the front main grid.

After the first type of cells are connected in series to the required number, the first small series of cell strings are stopped; after the first type of solar cells are connected in series to a certain number, a second type of solar cell are connected in series to form a second small series of cell strings.

Figure 12:
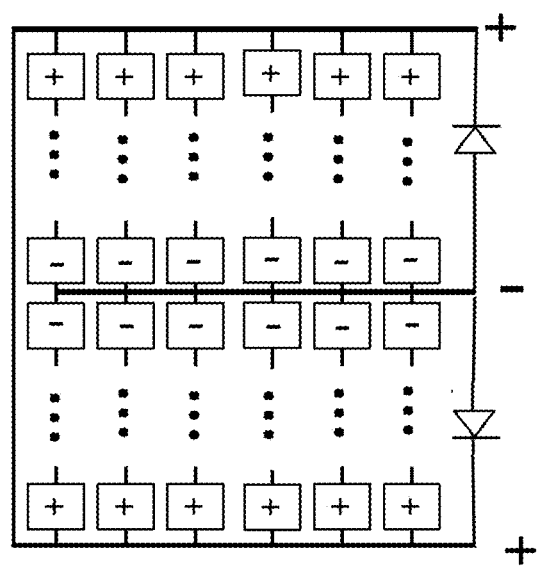
FIG. 12 is a circuit schematic diagram of modules in Embodiment 3.

Two small strings of cells are formed by connecting the same number of cells in series. The circuit diagram of the module is shown in FIG. 12.

Then, the electrode with the same polarity on the back and front of the last second type of solar cell of the second small cell string and the front electrode of the last second type of solar cell of the first small cell string are connected in parallel by shingling, so as to obtain the cell string needed, a conductive material is provided at the contact position of all electrodes, as shown in FIG. 11.

The preparation method of the shingled solar cell module includes the following steps.

In this embodiment, a conventional solar cell and a back-contact solar cell are combined to produce a module. After the two cells are cut, they are serially welded into a string by shingling manner. The segments of the cell string are connected in series on the back of the back-contact cell, and diodes are connected in parallel in an appropriate position to make modules. The specific steps are as follows:

selecting the solar cell A, and cut the solar cell A into 5 first type of solar cells a. (a), (b), (c), (d) of FIG. 2 are schematic diagrams before and after cutting the first type of solar cell, wherein (a) is the front of the solar cell before cutting, (b) is the back of the solar cell before cutting, (c) is the front of the solar cell after cutting, and (d) is the back of the solar cell after cutting;

(2) selecting the solar cell A', and cut the solar cell A' into 5 first type of solar cells a', (a), (b), (c), (d) of FIG. 3 are schematic diagrams before and after cutting the cell, wherein (a) is the front of solar cell before cutting, (b) is the back of the solar cell before cutting, (c) is the front of the solar cell after cutting, (d) is the back of the solar cell after cutting;

(3) selecting the solar cell B", and cut the solar cell B" into 5 second type of solar cells b. (a), (b), (c), (d) of FIG. 10 are schematic diagrams before and after cutting the solar cell, wherein (a) is the solar cell before cutting, (b) is the back of the solar cell before cutting, (c) is the front of the solar cell after cutting, (d) is the back of the solar cell after cutting.

(4) welding solar cell string C: take a piece of the first type of solar cell a', check the appearance of the cell, apply conductive adhesive to the front grid 10 of the first type of solar cell a', and then take another piece of the first type of solar cell a. Also check the appearance of the solar cell. Apply conductive adhesive to the front main grid 1 of the first type of solar cell a. Superpose the back main grid 2 of the first type of solar cell a and the front main grid 10 of the first type of solar cell a' with conductive adhesive, then heat welding. The entire welding process can be completed in the automatic string welding machine. The plurality of cut first type of solar cells a after cutting are connected in series to 30p to stop forming the cell string C;

(5) welding solar cell string D: take a piece of the first type of solar cell a', check the appearance of the cell, apply conductive adhesive to the front grid 10 of the first type of solar cell a', and then take another piece of the first type of solar cell a. Also check the appearance of the solar cell. Apply conductive adhesive to the front main grid 1 of the first type of solar cell a. Superpose the back main grid 2 of the first type of solar cell a and the front main grid 10 of the first type of solar cell a' with conductive adhesive, then heat welding. The entire welding process can be completed in the automatic string welding machine. The plurality of cut first type of solar cells a after cutting are connected in series to 29p and stop. Add the second type of solar cell b", check the appearance of the second type of solar cell b". Superpose the back main grid 15 with the same polarity on the back of the second type of solar cell b" and the front main grid 1 of the first type of solar cell a with conductive adhesive of the cell strings, then shingle and heat weld to form cell string D.

welding solar cell string group: Apply conductive adhesive on the front main grid 1 of the last first type of cell a of the cell string C. Superpose the back main grid 17 with the same polarity on the front of the last second type of solar cell b" of the cell string D and the front main grid 1 of the last first type of solar cell a to overlap each other, then shingle and heat weld to form two strings C and D connected in parallel. The entire welding process can be performed on an adsorbable heating table, as shown in FIG. 11.

connecting multiple cell strings in parallel, and use the bus bar 7 to connect the main grid at the back of the first type of solar cell a' of the six cell strings and leave the lead wire, use the bus bar on one side of the module to connect the end of the bus bar. Using the bus bar 7 with an insulating group on the back, the back of the second type of solar cell b" between different strings is connected in parallel with the main grid 16 at the back of the cell of the same polarity of the front electrode and the lead is left. FIG. 17 is a form of the bus bar 7. The white is in contact with the negative electrode on the back of the cell, and the black insulating part is in contact with the back of the cell;

laying the cover plate material, EVA and/or POE, cell string, EVA and/or POE, and back plate material in order from top to bottom;

conducting EL test and lamination post-processing procedures after completion of laying;

soldering junction boxes with diodes between lead wires according to the circuit diagram to obtain the shingled solar cell module.

Embodiment 4

The structural schematic diagram of the solar cell module provided in this embodiment is the same as that in embodiment 1.

The two small cell strings are made up of the same number of the first type of solar cells and/or the second type of solar cells connected in series. The area of the cell which is paralleled in the middle is larger than other cells, and the power and current are twice of other cells. In this embodiment, there are two kinds of cell strings, one is the middle cell led out of the positive electrode, and the other is the middle cell led out of the negative electrode.

Each cell string is mainly composed of two small shingled strings containing two types of cells in series and connected in parallel by using a large-area slit cell.

The specific way for the serial-parallel connection of the cell strings led by the positive electrode in the middle cell is: the electrodes on both sides of the back of a large-area split cell 2a' cover the electrode of front side of the two strings that have the same number, including two types of cell strings connected in series, and the two cell strings are connected in parallel. The last cell of the two cell strings in series is a back-contact cell. There is a conductive material between all the front and back electrodes.

The specific way for the serial-parallel connection of the cell strings led by the negative electrode in the middle cell is: the electrodes on both sides of the back of a large area of split-cell 2b" cover the electrode of front side of the two strings that have the same number including two types of cell strings connected in series, and the two cell strings are connected in parallel. Conductive materials are provided between all front and back electrodes.

Specifically:

Taking a p type of crystalline silicon cell as an embodiment here, the front electrode of the cell is a negative electrode, the back electrode is a positive electrode, the front electrode of a back-contact cell is a negative electrode, the back electrode has a positive electrode on the side, and the positive electrode and the negative electrode in the middle.

As shown in FIG. 1, the front and back sides of the solar cell before cutting are provided with main grids respectively, and the solar cell is cut near the reserved position of the main grid to form a plurality of first type of solar cell, the main grid is distributed on the long edge of the first type of solar cell, and is perpendicular to the short edge of the first type of solar cell.

As shown in FIG. 8, the solar cell before cutting is a back-contact solar cell. The front side of the back-contact solar cell is not provided with electrodes. The positive and negative electrodes of the back-contact solar cell are both provided on the back of the back-contact solar cell. The solar cells are cut near the reserved position of the back main grid to form a plurality of second type of solar cells b'. The second type of solar cell has a main grid on the upper side of the other side. There are main grids with the same polarity as the front side in the middle, and all the main grids are perpendicular to the short edge of the second type of solar cell.

Figure 13:
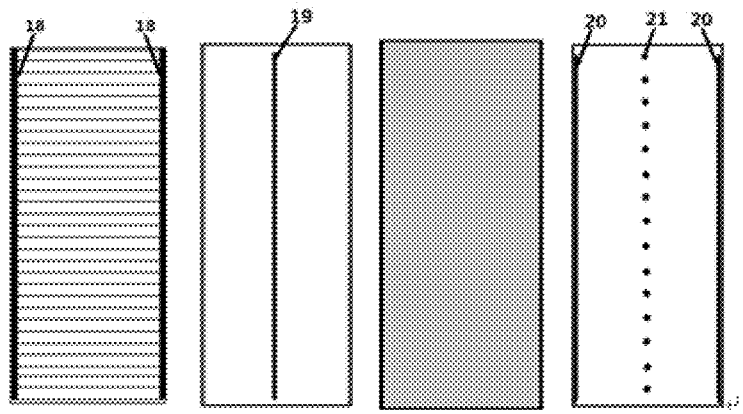
FIG. 13 is a schematic diagram of a large-area slit cell in Embodiment 4, wherein (8): the front side of the conventional solar cell 2a" (A-III type of solar cell), (b): the back side of the conventional cell 2a", (c): the front side of the back-contact cell 2b" (B-IV type of solar cell), (d): the back side of the back-contact cell 2b"

As shown in FIG. 13, the large-area conventional slit cell is about twice the size of other cells, and the current and power are also about twice of other cells. There are two main grids on both sides of the front long edge, and a main grid in the middle of the back; the second type of large-area back-contact slit cell is also about twice the size of other cells, and the current and power are also about twice of other cells. There is no main grid on the front, and there are two back main grids on both sides of the long edge of the back, and a main grid with the same polarity as the front in the middle.

Figure 14:
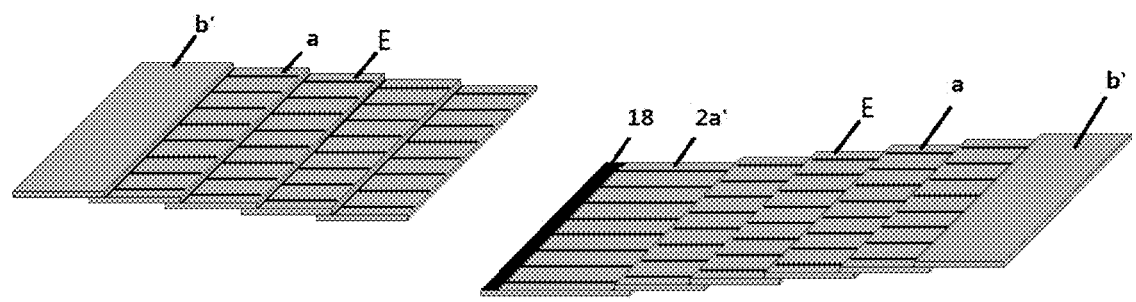
FIG. 14 is a schematic diagram of a series-parallel connection of a cell led by an intermediate cell from the positive electrode in Embodiment 4.

As shown in FIG. 14, when the cut first type of solar cells are connected in series with each other, the connection between two adjacent solar cells is connected in series by shingling, in which the back main grid of one of the solar cells is arranged on the front main grid of the adjacent one of the solar cells, and a conductive material is provided at a position where the back main grid contacts the front main grid.

The preparation method of the shingled solar cell module includes the following steps.

In this embodiment, a conventional solar cell and a back-contact solar cell are combined to produce a module. After the two types of cells are cut, they are serially welded into a string by shingled manner. The segments of the cell string are connected in series on the back of the back-contact cell, and diodes are connected in parallel to make modules. The specific steps are as follows:

selecting the solar cell A, and cut the solar cell A into 5 first type of solar cells a. (a), (b), (c), (d) of FIG. 2 are schematic diagrams before and after cutting the first type of solar cell, wherein (a) is the front of the solar cell before cutting, (b) is the back of the solar cell before cutting, (c) is the front of the solar cell after cutting, and (d) is the back of the solar cell after cutting;

(2) selecting the solar cell A', and cut the solar cell A' into 5 first type of solar cells a', (a), (b), (c), (d) of FIG. 3 are schematic diagrams before and after cutting the cell, wherein (a) is the front of solar cell before cutting, (b) is the back of the solar cell before cutting, (c) is the front of the solar cell after cutting, (d) is the back of the solar cell after cutting;

(3) selecting the back-contact solar cell B", and cut the solar cell B" into 5 second type of solar cells b. (a), (b), (c), (d) of FIG. 10 are schematic diagrams before and after cutting the solar cell, wherein (a) is the solar cell before cutting, (b) is the back of the solar cell before cutting, (c) is the front of the solar cell after cutting, (d) is the back of the solar cell after cutting.

(4) welding solar cell string E: take a piece of the first type of solar cell a, check the appearance of the cell, apply conductive adhesive to the front grid 1 of the first type of solar cell a, and then take another piece of the first type of solar cell a. Also check the appearance of the solar cell and apply conductive adhesive to the front main grid. Superpose the back main grid 2 of solar cell a and the other front main grid 1 with conductive adhesive, then heat welding. The entire welding process can be completed in the automatic string welding machine. The plurality of cut first type of solar cells a after cutting are connected in series to 29p and stop. Add the solar cell b', check the appearance of the solar cell b'. Superpose the back main grid 13 of the second type of solar cell b' and the front main grid 1 of the first type of solar cell a with conductive adhesive of the cell strings, then heat welding to form cell string E.

(5) paralleling solar cell string E: take a large area of the first type of slit cell 2a', as shown in FIGS. 13 (a), (b), apply conductive adhesive to the two front main grids 18 of the first type of slit cell 2a', arrange it and the back main grid 2 of the first cell a of the two cell strings E respectively to overlap each other, then heat welding to form cell string G;

(6) welding solar cell string F: take a piece of cell a', check the appearance of the cell, apply conductive adhesive to the front grid 10 of the first type of solar cell a', and then take another piece of cell a. Also check the appearance of the cell. Apply conductive adhesive to the front main grid 11 of solar cell a'. Superpose the back main grid 11 of the cell a' and the front main grid 1 of the cell a with conductive adhesive, then shingle and heat weld. The entire welding process can be completed in the automatic string welding machine. The plurality of cut first type of solar cells a after cutting are connected in series to 30p and stop to form cell string F.

Figure 15:
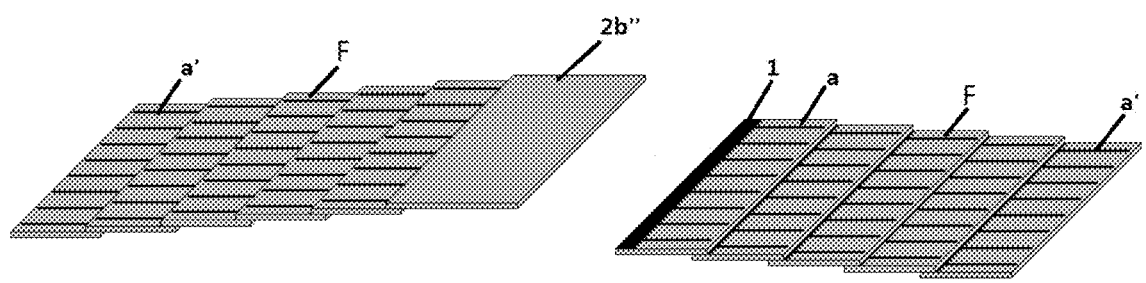
FIG. 15 is a schematic diagram of a series-parallel connection of a cell led by an intermediate cell from the negative electrode in Embodiment 4.
Figure 16:
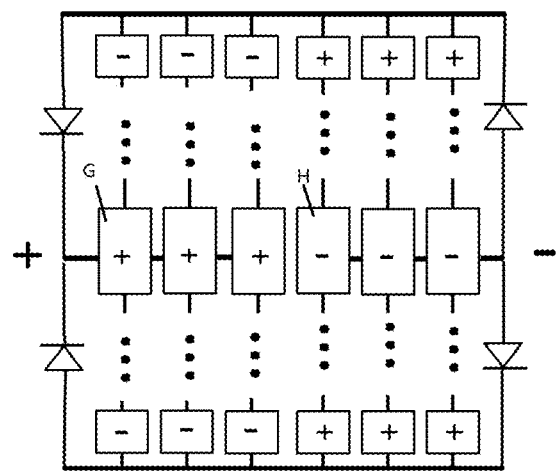
FIG. 16 is a circuit schematic diagram of the modules of Embodiment 4.

(7) paralleling solar cell string F: take a large area of the first type of slit cell 2b", as shown in FIGS. 13 (c), (d), apply conductive adhesive to the two front main grids 20 of the first type of slit cell 2b", arrange it and the back main grid 1 of the first cell a of the two cell strings F respectively to overlap, then heat welding to form cell string H;

(8) welding solar cell string group: According to the circuit diagram shown in FIG. 16, arrange 3 cell strings G and 3 cell strings H from left to right; Use the bus bar to connect the back middle grid 14 of the upper cell b' of the three cell strings G to the back middle grid 12 of the cell a' of the upper end of the three cell strings H; also use the bus bar with an insulating bar 7 to connect the lower cell of the 6 cell strings; In addition, use a conventional bus bar 7 to connect the main grid 19 on the back of the large-area first type slit cell 2a' in the middle of the three cell strings G, leaving the lead as the positive electrode, as shown in FIG. 15. FIG. 17 is a form of the bus bar 7. The white is in contact with the negative electrode on the back of the cell, and the black insulating part is in contact with the back of the cell;

laying the cover plate material, EVA and/or POE, cell string, EVA and MPOE, and back plate material in order from top to bottom;

conducting EL test and lamination post-processing procedures after completion of laying;

soldering junction boxes with diodes between lead wires according to the circuit diagram to obtain the shingled solar cell module.

The present application also provides the following solutions:

Solution 1. A solar cell module, including a cover material (101), a first encapsulating film (201), a cell string group (301), a second encapsulating film (401), and a back plate (501). The cell string group (301) is formed by connecting a plurality of cell strings (601), and is characterized in that each cell string (601) is composed of a plurality of the first type of solar cells (701) connected with at least one second type of solar cells (801), wherein the polarities of the front electrodes of the plurality of first type of solar cells (701) are consistent, and the polarity of the back electrodes of the plurality of solar cells (701) are also consistent. The polarities of the front electrodes of the plurality of first type of solar cells (701) and the back electrodes of the plurality of first type of solar cells (701) are opposite, and the second type of solar cells (801) has a positive electrode and a negative electrode on the back;

Moreover, at least one of the plurality of first type of solar cells (701) has a first current derivation unit (901) on the back side, and the at least one second type of solar cell (801) has a second current derivation unit (902) on the back side.

Solution 2. The solar cell module according to solution 1, wherein the first type of solar cell (701) is cut from a whole solar cell, and the structures of a plurality of first type of solar cells (701) formed after cutting are similar. The second type of solar cell (801) is also cut from the whole solar cell, and the structures of the plurality of second type of solar cells (801) formed after cutting are the same.

Solution 3. The solar cell module according to solution 2, wherein each of the cell strings (601) is connected by a plurality of first type of solar cells (701) connected in series with each other, and then add a second type of solar cell (801). Or each of the cell strings (601) is composed of a plurality of first type of solar cells (701) connected in series with each other, add a second type of cell (801) connected with the series-connected/parallel-connected first type of solar cells (701); or each of the cell strings (601) is formed by connecting a plurality of first type of solar cells (701) and second type of solar cells (801) alternately.

Solution 4. The solar cell module according to Solution 3, wherein the plurality of first type of solar cells (701) are connected in series with each other, wherein the front electrode of an adjacent first type of solar cell is covered with the back electrode of a first type of solar cell, a conductive material is provided between the covered back electrode and the front electrode; the connection between the first type of solar cell (701) and the second type of solar cell (801) is the connection between the front electrode of the first type of solar cell (701) and the back electrode of the second type of solar cell (801), and a conductive material is provided between the connected front electrode and back electrode.

Solution 5. The solar cell module according to Solution 4, wherein the connection between the first type of solar cell (701) and the second type of solar cell (801) is series or parallel, and when the polarities of the connection electrodes of the first type of solar cell (701) and the second solar cell (801) are the same, the connection between the first type of solar cell (701) and the second type of solar cell (801) is parallel; when the polarities of the connection electrodes of the first type of solar cell (701) and the second type of solar cell (801) are opposite, the connection between the first type of solar cell (701) and the second type of solar cell (801) is series.

Solution 6. The solar cell module according to Solution 2, wherein the first current derivation unit (901) and the second current derivation unit (902) are welding strips (7), all of the welding strips (7) are led out from the back of the first type of solar cell (701) and the second type of solar cell (801) and reserved with lead wires.

Solution 7. The solar cell module according to Solution 2, wherein an electrode is also provided on the front side of the second type of solar cell (801). The electrode is led to the back side of the second type of solar cell through a perforation to form an electrode of the same polarity as the front side, and the positive electrode and the negative electrode on the back side of the second type of solar cell are insulated.

Solution 8. The solar cell module according to Solution 2, wherein the front side of the second type of solar cell (801) is not provided with an electrode, and the positive electrode and the negative electrode on the back side of the second type of solar cell are insulated.

Solution 9. The preparation method of the solar cell module includes the following steps:

(1) selecting the first type of solar cell (701) and the second type of solar cell (801);

(2) connecting a plurality of first type of solar cell (701) and at least one second type of solar cell (801) to form a cell string (601), and then connecting a plurality of cell strings (601) so as to form a cell string group (301);

(3) using the first current derivation unit (901) to connect the first type of solar cells (701) between different cell strings in parallel on the back and reserve the lead wire, and using the second current derivation unit (902) to connect the second type of solar cells (801) between different cell strings in parallel on the back and reserve the lead wires;

(4) laying the cover plate material (101), the first encapsulating film (201), the cell string group (301), the second encapsulating film (401), and the back plate material (501) in order from bottom to top;

(5) conducting EL test and lamination post-processing procedures after completion of laying;

(6) soldering junction boxes and the diodes at each lead wire set aside to obtain the solar cell module.

Solution 10. A solar cell module, including a cover material (101), a first encapsulating film (201), a cell string group (301), a second encapsulating film (401), and a back plate (501). The cell string group (301) is formed by connecting a plurality of cell strings (601), and is characterized in that each cell string (601) is composed of a plurality of the first type of solar cells (701) connected with at least one second type of solar cells (801), wherein the polarities of the front electrodes of the plurality of first type of solar cells (701) are consistent, and the polarity of the back electrodes of the plurality of solar cells (701) are also consistent. The polarities of the front electrodes of the plurality of first type of solar cells (701) and the back electrodes of the plurality of first type of solar cells (701) are opposite, and the second type of solar cells (801) has a positive electrode and a negative electrode on the back;

A current derivation unit is provided on the back of the solar cells at both ends of the cell string (601).

Solution 11. The solar cell module according to Solution 10, characterized in that the solar cell at one end of the cell string (601) is the first type of solar cell (701), and the solar cell at the other end is the second type of solar cell (801);

A first current derivation unit (901) is provided on the back side of the first type of solar cell (701), and a second current derivation unit (902) is provided on the back side of the second type of solar cell (801).

Solution 12. The solar cell module according to Solution 10, characterized in that the solar cells at both ends of the cell string (601) are the first type of solar cell (701), and the second type of solar cell (801) is located in the middle of the cell string (601);

A first current derivation unit (901) is provided on the back of the first type of solar cell (701).

Solution 13. The solar cell module according to Solution 12, characterized in that a second current derivation unit (902) is provided on the back of the second type of solar cell (801).

The above lists some specific embodiments to illustrate the present invention. It is necessary to point out here that the above specific embodiments are only used to further illustrate the present invention and do not represent limitations on the protection scope of the present invention. Some non-essential modifications and adjustments made by others according to the present invention still fall within the protection scope of the present invention.

The invention claimed is:

1. A solar cell module comprising:
   a cover plate material,
   a first encapsulating film,
   a second encapsulating film,
   a back plate material, and
   a solar cell string group comprising a plurality of solar cell strings;
     wherein each of the plurality of solar cell strings comprises:
       a plurality of first type solar cells,
         wherein the plurality of first type solar cells comprises:
           a first group of solar cells;
             wherein each solar cell of the first group of solar cells comprises a front electrode and a back electrode;
             wherein the front electrode of each solar cell of the first group of solar cells is a positive electrode;

wherein the back electrode of each solar cell of the first group of solar cells is a negative electrode;

wherein the first group of solar cells are connected serially; and a second group of solar cells;

wherein each solar cell of the second group of solar cells comprises a front electrode and a back electrode;

wherein the front electrode of each solar cell of the second group of solar cells is a negative electrode;

wherein the back electrode of each solar cell of the second group of solar cells is a positive electrode;

wherein the second group of solar cells are connected serially;

wherein at least one of the plurality of first type solar cells has a first current derivation unit on a back side thereof; and at least one second type solar cell;

wherein the at least one second type solar cell comprises back electrodes comprising a positive electrode and a negative electrode;

wherein the at least one second type solar cell has a second current derivation unit on a back side thereof;

wherein the first group of solar cells are connected with the second type solar cell by connecting the positive electrode of the last solar cell of the first group solar cells with a first one of the negative electrode and the positive electrode of the second type solar cell, wherein the second group of solar cells are connected with the second type solar cell by connecting the negative electrode of the last cell of the second group of solar cells with a second one of the negative electrode and the positive electrode of the second type solar cell.

2. The solar cell module according to claim 1, wherein the first group and the second group of the first type solar cells are cut from a whole piece of solar cell, wherein the plurality of the first group of the first type solar cells formed by cutting have the same structure, the plurality of the second group of the first type solar cells formed by cutting have the same structure, and wherein said second type solar cell is also cut from a whole piece of solar cell, the plurality of second type solar cells formed by cutting has the same structure.

3. The solar cell module according to claim 1, wherein in the first and second groups of the first type of solar cells, the back electrode of one first type solar cell overlap the front electrodes of one adjacent first type solar cells by shingling, and the solar string further comprises a conductive material being located between the overlapped back electrode and the front electrode;

wherein the front electrode of said first type solar cell is connected with the back electrode of said second type solar cell, a conductive material is located between the connected front electrode and back electrode.

4. The solar cell module according to claim 2, wherein the first current derivation unit and the second current derivation unit are welding strips that extends from the back of the first type solar cell and second type solar cell.

5. The solar cell module according to claim 2, wherein, said second type solar cell is also provided with an electrode on the front side, and said electrode is led to the back of said second solar cell by perforation and an electrode having the same polarity as the front side is formed on the back side, and the positive electrode and the negative electrode on the back side of said second type solar cell are insulated.

6. The solar cell module according to claim 2, wherein, there is no electrode on the front side of said second type solar cell, and the positive electrode and the negative electrode on the back side of said second type solar cell are insulated.

* * * * *